US007252872B2

(12) United States Patent
Fujii et al.

(10) Patent No.: US 7,252,872 B2
(45) Date of Patent: Aug. 7, 2007

(54) JOINED STRUCTURES OF CERAMICS

(75) Inventors: Tomoyuki Fujii, Nagoya (JP);
Akiyoshi Hattori, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 480 days.

(21) Appl. No.: 10/755,913

(22) Filed: Jan. 13, 2004

(65) Prior Publication Data
US 2004/0146737 A1    Jul. 29, 2004

(30) Foreign Application Priority Data
Jan. 29, 2003    (JP)    ............. P2003-20592

(51) Int. Cl.
*B32B 1/08*    (2006.01)
*B32B 3/26*    (2006.01)
*B32B 15/04*    (2006.01)
*B32B 18/00*    (2006.01)
*B23B 3/28*    (2006.01)

(52) U.S. Cl. ............ 428/213; 428/215; 428/627; 428/630; 428/672; 428/704; 279/128

(58) Field of Classification Search ........ 428/545, 428/600, 615, 630, 627, 632, 650, 672, 663, 428/678, 680, 681, 213, 215, 220, 332, 704
See application file for complete search history.

(56) References Cited

U.S. PATENT DOCUMENTS

| 6,020,076 A | * | 2/2000 | Fujii et al. | ............. 428/621 |
| 6,617,514 B1 | * | 9/2003 | Ushikoshi et al. | ........ 174/84 R |
| 2002/0139563 A1 | | 10/2002 | Fujii et al. | |
| 2003/0047589 A1 | * | 3/2003 | Fujii | ............. 228/122.1 |
| 2004/0016792 A1 | * | 1/2004 | Fujii et al. | ............. 228/194 |

FOREIGN PATENT DOCUMENTS

| JP | 10-209255 | 8/1998 |
| JP | 11-12053 | 1/1999 |
| JP | 2002-293655 | 10/2002 |

* cited by examiner

*Primary Examiner*—Michael E. Lavilla
(74) *Attorney, Agent, or Firm*—Burr & Brown

(57) ABSTRACT

An object of the present invention is to provide a joined structure effective for preventing crack formation after thermal cycles. The joined structure has a ceramic member 1, a metal member 4 to be joined, and a metal fixed member 3 fixed to the ceramic member 1 and having an exposed face 3b exposed along the joining face 1d of the ceramic member 1. A joining layer 7 is provided between the ceramic member 1 and the metal member 4 and between the exposed face 3b of the fixed member 3 and the metal member 4. The joining layer 7 has thicker and thinner portions 7a and 7b. Alternatively, the joining layer 7 has a maximum thickness of 0.15 mm or more.

9 Claims, 6 Drawing Sheets

JOINED STRUCTURES OF CERAMICS

This application claims the benefit of a Japanese Patent Application P2003-20592 filed on Jan. 29, 2003, the entirety of which is incorporated by reference.

BACKGROUND OF THE INVENTION

1. Field of the Invention

The invention relates to a joined structure of a ceramic member and a metal member.

2. Related Art Statement

Electrostatic chucks have been used to adsorb and hold semiconductor wafers in transferring, light-exposing, film-forming such as CVD and sputtering, fine processing, washing, etching, dicing, etc. for semiconductor wafers. Dense ceramics are noted as substrates for such electrostatic chucks. Particularly, in a semiconductor producing apparatus, a halogen based corrosive gas such as $ClF_3$ is often used as an etching gas or a cleaning gas. In order to rapidly heat and cool a semiconductor wafer while being held by such a substrate, the substrate of the electrostatic chuck desirably has a high heat conductivity. Further, it is desired that the substrate has such thermal shock resistance as not to be destroyed by rapid temperature changes. Dense aluminum nitride and alumina have high corrosion resistance against the halogen based corrosion gas mentioned above.

In the field of the semiconductor producing apparatuses, susceptors in which built-in high frequency electrodes for generating plasma have been practically used. In the field of such high frequency electric power generating apparatuses, a metal electrode is embedded in a substrate of aluminum nitride or dense alumina. Further, in the field of the semiconductor producing apparatuses, there are used ceramic heaters in which a metal resistor is embedded in a substrate of aluminum nitride or alumina for controlling the temperature of a wafer in each process.

In such devices, it is necessary to embed a metal electrode in a substrate of a ceramic material such as aluminum nitride or the like and to electrically connect the metal electrode to an outer connector for supplying electric power. The connecting portion of the metal electrode and outer connector is exposed against thermal cycles of high and low temperatures under an oxidizing atmosphere or corrosive gas atmosphere. It is desired to preserve good electrical connection and a high joining strength over a long time under such severe circumstances.

The applicant filed a Japanese patent publication No. 10-209, 255A, and disclosed a connecting structure of a connector and a metal electrode. In the structure, a conductor of a low thermal expansion coefficient is inserted between the metal and ceramic members to relax the residual stress remained in the connecting portion. The applicant has further disclosed an improved structure based on that of the Japanese patent publication No. 10-209, 255A, in Japanese patent publication No. 11-12, 053A. In the structure, a soft brazing material of an alloy containing gold, platinum, or palladium is used to improve the anti-oxidation property of the brazing material and to further relax the residual stress.

The following problems, however, may occur when a heater or an electrostatic chuck having the above described joining portion is manufactured in a large scale. That is, when the joined structure is produced, a metal brazing material such as a solder of the alloy of gold is provided between the conductor of a low thermal expansion coefficient and the surface of the ceramic member. The brazing material is then heated and melted to wet the surface of the ceramic member and that of the conductor of a low thermal expansion coefficient, so that they are joined with each other. The thickness of the resulting joining layer tends to be, however, variously changed. The reasons are as follows. It is relatively difficult to sufficiently wet the surface of the ceramic member so that the molten solder tends to flow out of the joining layer. Since the molten brazing material is leaked out of the joining portion, it is difficult to accurately control the amount of the molten brazing agent remaining in the joining portion. Consequently, the thickness of the joining layer is fractuated or sometimes reduced to a thickness of 0.05 mm or lower. When the thickness of the joining layer is small, thermal cycles applied on the joining layer may induce a substantial stress along the interface of the joining layer and ceramic member. Cracks may be generated in the ceramic member or joining layer so that the resulting joined article is out of a specification.

SUMMARY OF THE INVENTION

An object of the present invention is to provide a joined structure having a ceramic member, a metal member, a metal fixed member fixed to the ceramic member and having an exposed face, and a joining layer, so that cracks may be prevented after thermal cycles.

The present invention provides a joined structure having a ceramic member, a metal member having a joining face, and a metal fixed member fixed to the ceramic member and having an exposed face. In the structure, a joining layer is provided between the ceramic member and the joining face of the metal member and between the exposed face of the fixed member and the joining face of the metal member. The joining layer has thicker and thinner portions.

The inventors have studied the reasons for crack formation in the joining layer and ceramic member, and have found that the cracks may be primarily observed in a region having a small thickness in the joining layer. Based on the findings, they have applied a design of a joining layer having thicker and thinner portions so that at least the thicker portion may remain in the resulting joined body. That is, according to the design of the joining layer, even if the wettability of molten brazing agent is low on the surface of the ceramic member, the thicker portion having a predetermined thickness can be secured in the resulting joining layer. It is thus possible to relax excess stress preliminarily in the thicker portion of the joining portion during thermal cycles and to prevent the crack formation upon thermal cycles.

The present invention further provides a joined structure having a ceramic member, a metal member having a joining face, a metal fixed member fixed to the ceramic member and having an exposed face. A joining layer is provided between the ceramic member and the joining face of the metal member, and between the exposed face of the fixed member and the joining face of the metal member. The joining layer has a maximum thickness of 0.15 mm or more.

Based on the above findings, the inventors have studied the maximum thickness of the joining layer effective for preventing crack formation in the joining portion after thermal cycles. It was finally found that the crack formation in the joining portion can be considerably reduced after thermal cycles by increasing the maximum thickness of the joining layer at a value of 0.1.5 mm or more.

These and other objects, features and advantages of the invention will be appreciated upon reading of the following description of the invention when taken in conjunction with the attached drawings, with the understanding that some modifications, variations and changes of the same could be easily made by the skilled person in the art.

BRIEF DESCRIPTION OF THE DRAWINGS

FIG. 1 is a cross sectional view schematically showing a joined structure according to one embodiment of the present invention, having a joining layer 7 with thinner portions 7b and a thicker portion 7a.

DETAILED DESCRIPTION OF THE INVENTION

Figure 1:
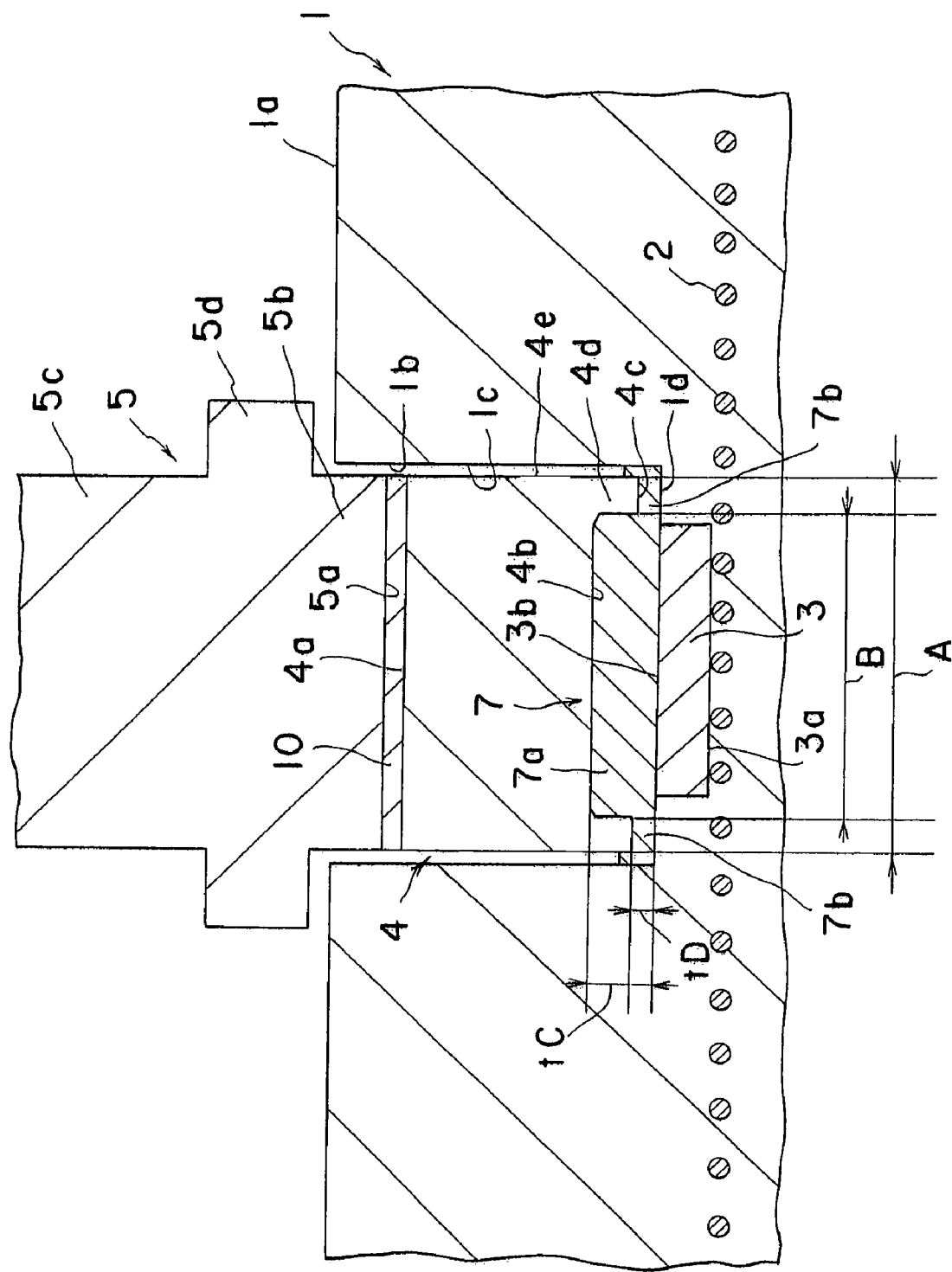

The invention will be further described referring to the attached drawings. FIG. 1 is a cross sectional view schematically showing a joined structure according to one embodiment of the invention. An electrode 2 is embedded in a ceramic member 1 having, for example, a shape of a disk. The electrode 2 is formed of, for example, a metal mesh or net.

A recess 1b is provided on the back face 1a of the member 1. The electrode 2 composed of a mesh and a fixed member 3 made of molybdenum or the alloy of molybdenum are embedded in the ceramic member 1. One surface 3b of the fixed member 3 is exposed to the bottom surface 1d of the recess 1b, and the other face 3a of the fixed member 3 contacts the metal electrode 2. 1c represents the side wall face of the recess 1b.

A member 4 to be joined having a shape of, for example, a disk, is set in the recess 1b. The bottom face 4c of the member 4 opposes to the joining face 1d of the ceramic member 1 and joining face 3b of the fixed member 3. In the present example, a ring-shaped protrusion 4d is formed on the periphery of the bottom face of the member 4 to be joined. A ring shaped face 4c is formed on the tip face of the ring-shaped protrusion 4d. A circular recess 4b is formed inside of the ring-shaped protrusion 4d. A joining layer 7 is provided between the member 4 to be joined and ceramic member 1 and between the member 4 and fixed member 3. The joining layer 7 comprises a joining material interposed between the bottom face 4c and ceramic member 1 and filled in the recess 4b. Consequently, the joining layer 7 has a circular and thicker portion 7a having a larger thickness and a shape of a circle, and a thinner portion 7b having a smaller thickness and a shape of a ring The thinner portion 7b is interposed between the ring-shaped protrusion 4d and the ceramic member 1.

A member 5 for supplying electric power has a main body 5c out of the ceramic member 1, a flange portion 5d and an end portion 5b in the recess 1b. The end face 5a of the end portion 5b and end face 4a of the member 4 to be joined are joined with each other through a conductive joining layer 10, preferably made of a brazing material.

Figure 2:
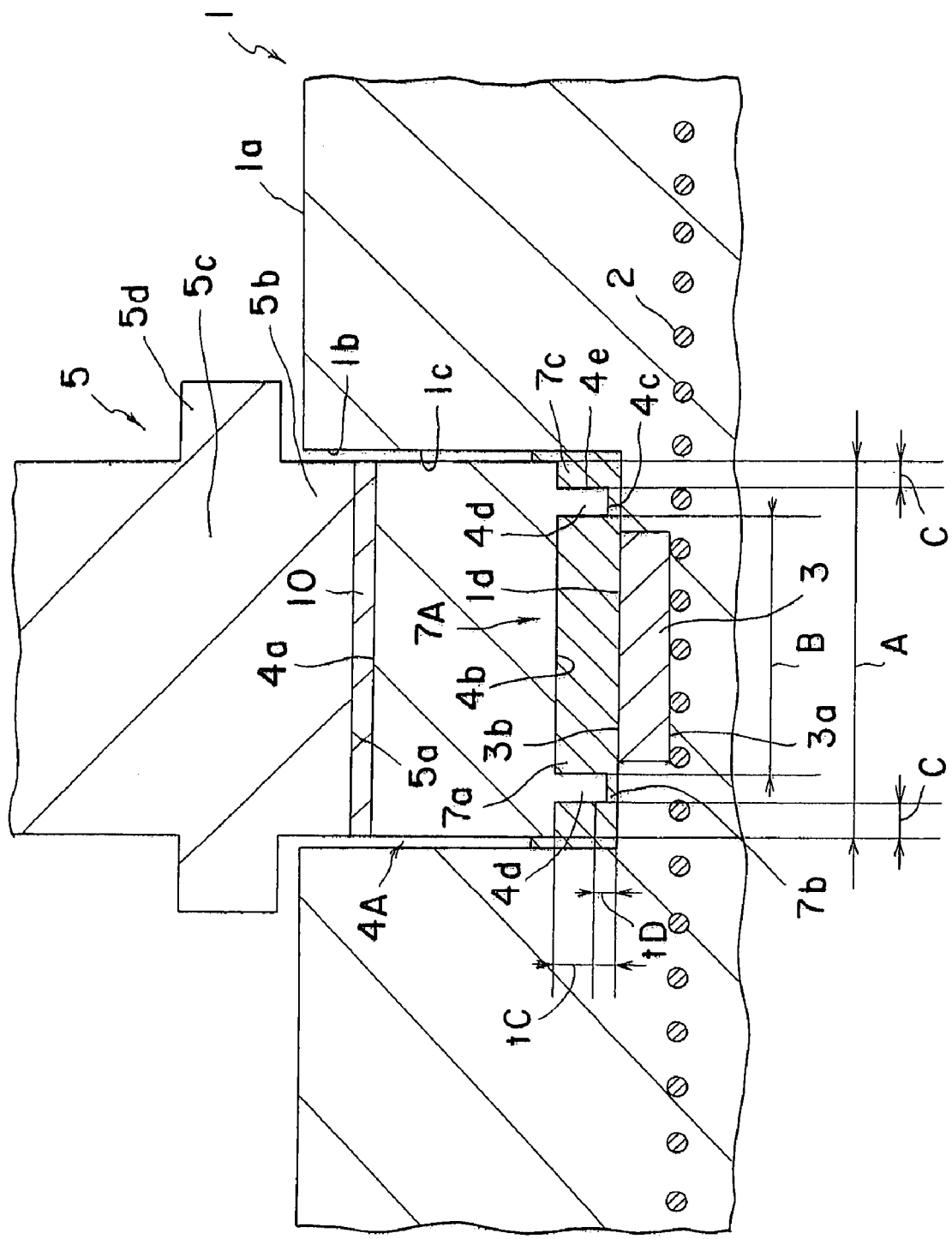
FIG. 2 is a cross sectional view schematically showing a joined structure according to another embodiment of the present invention, having a joining layer 7A with thicker portions 7a, 7c and thinner portions 7b.

In an example shown in FIG. 2, a ring-shaped protrusion 4d is formed on the periphery of a member 4 to be joined, and a circular recess 4b is formed inside of the ring-shaped protrusion 4d. Further, a ring-shaped recess or step 4e is formed outside of the ring-shaped protrusion 4d.

A joining portion 7A is provided between a member 4A to be joined and ceramic member 1 and between the member 4A and fixed member 3. The joining layer 7A has a circular thicker portion 7a, a ring-shaped thinner portion 7b surrounding the thicker portion 7a and a ring-shaped thicker portion 7c surrounding the thinner portion 7b.

Figure 3:
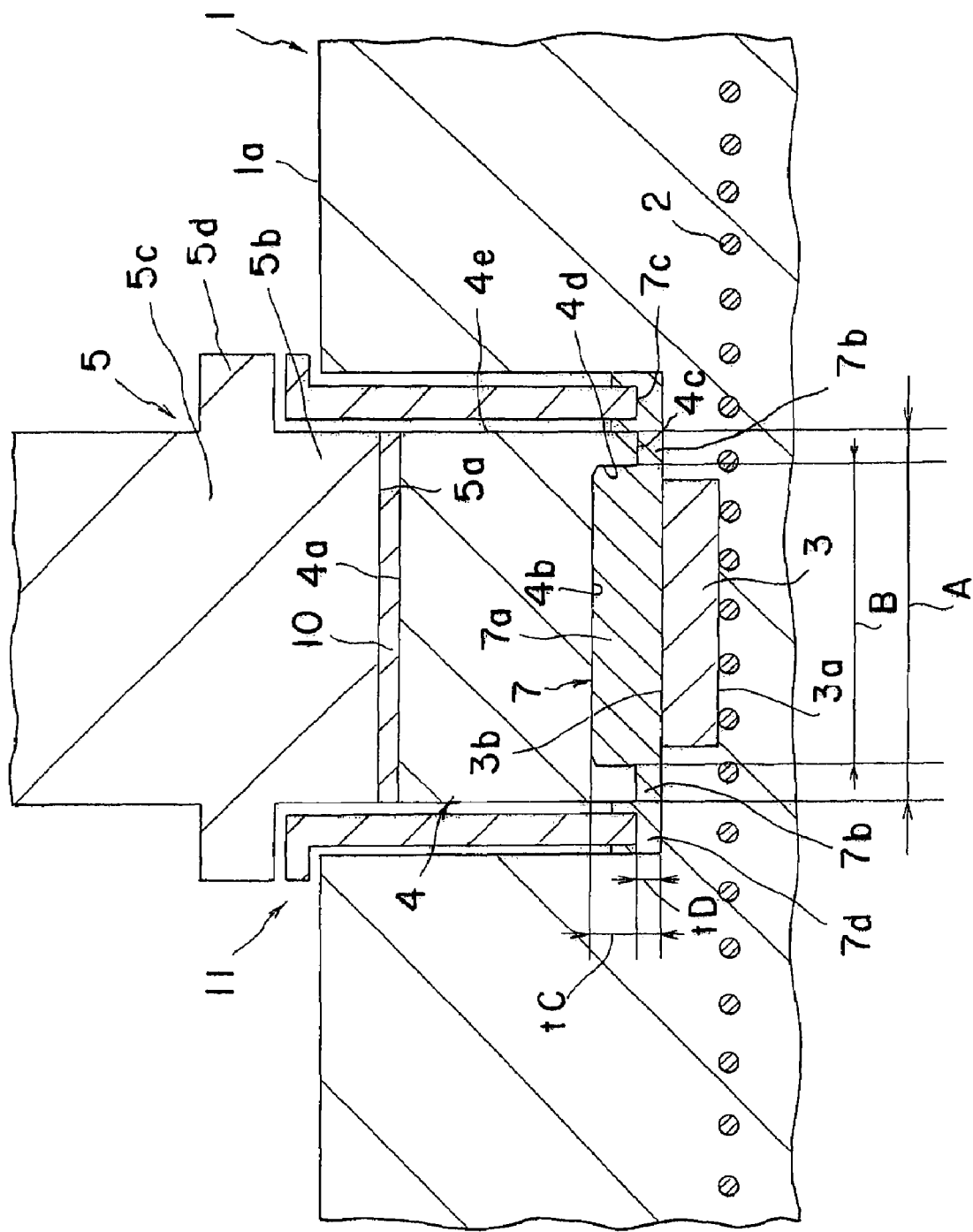
FIG. 3 is a cross sectional view schematically showing a joined structure according to still another embodiment of the present invention, having a member 4 to be joined and a tubular sealing member 11.

In an example shown in FIG. 3, based on the structure shown in FIG. 1, a tubular air-tight sealing member 11 is further provided. That is, the fixed member 4 and the end portion 5b of the member 5 for supplying electric power are contained inside of the tubular sealing member 11. The end of the sealing member 11 contacts the joining layer 7d and thus joined with the ceramic member 1.

According to the present invention, the joining layers 7 and 7A have thicker portions 7a, 7c and thinner portions 7b, respectively. The thickness "tC" of the thicker portion may preferably be 0.15 mm or more, more preferably 0.2 mm or more and most preferably 0.5 mm or more, for preventing crack formation in the joining portion. The upper limit of the thickness "tC" of the thicker portion is not particularly defined, and may preferably be 1.0 mm or more for improving the joining strength.

The thickness "tD" of the thinner portion 7b may preferably be 0.01 mm or more for improving the joining strength. The upper limit of the thickness "tD" of the thinner portion 7b is not particularly defined, as far as it is smaller than that of the thicker portion. The thickness "tD" of the thinner portion is, however, limited by the wettability of the joining agent onto the surface of the ceramic member 1, so that it is rather difficult to increase the thickness "tD" over a some common specific value. The thickness "tD" may normally be 1.0 mm or smaller and 0.5 mm or smaller in many cases.

The difference (tC−tD) may preferably be 0.15 mm or more, more preferably be 0.2 mm or more and most preferably be 0.5 mm or more, for preventing crack formation in the joining portion. The upper limit of the difference (tC−tD) is not particularly defined, and may preferably be 1.0 mm or more, on the viewpoint of joining strength.

Further in the present invention, the maximum thickness of each of the joining layers 7 and 7A may be made 0.15 mm or larger. In this case, the maximum thickness may preferably be 0.2 mm or more, and most preferably 0.5 mm or more.

In a preferred embodiment, as shown in FIG. 2, the thicker portion 7c is provided in the periphery of the joining face of the member 7A to be joined. A stress tends to be concentrated on the corners of the joining portion. The thicker portion 7c is thus provided in the periphery of the joining face of the member 7A to be joined for relaxing the stress exerted onto the corners.

A ratio "B/A" of the width B of the thicker portion to the width A of the joining layer may preferably be 0.6 or higher and more preferably 0.7 or higher on the viewpoint of the effects of the present invention. B/A is lower than 1.0 and more preferably 0.95 or lower on the viewpoint of the present invention.

The thicker and thinner portions may be shaped and patterned by any methods. In a preferred embodiment, a protrusion 4d is formed on the joining face of the member 4 to be joined, or a protrusion is provided on the joining face 3b of the fixed member 3. The thinner portion may be shaped over the protrusion and the thicker portion may be provided in the lateral side of the protrusion. Particularly preferably, a protrusion is provided on the side of the joining face of the member 4 to be joined. In this case, the protrusion 4d may preferably be integrated with the member 4 to be joined. Alternatively, the protrusion 4d may be composed of a separate spacer. Further, the protrusion 4d and the member 4 to be joined may be made of the same or different material. When the protrusion 4d is separated from the member 4 to be joined, it is necessary that the material for the protrusion has a melting point higher by 100° C. or more than the joining temperature to prevent substantial melting of the material into the molten brazing material. Further the material may preferably have a low thermal expansion coefficient. The following materials may be listed.

Metals: Fe—Ni alloy, Fe—Ni—Co alloy, Mo, W etc.

Ceramics: alumina, aluminum nitride, silicon carbide, boron nitride etc.

The ceramic member may be one of the following

A heater having a ceramic substrate and a heat resistor embedded in the substrate;

An electrostatic chuck having a ceramic substrate and an electrode for electrostatic chuck embedded in the substrate;

An electrostatic chuck having a ceramic substrate, an electrode for electrostatic chuck and a heat resistor both embedded in the substrate;

An electrode system having a ceramic substrate and an electrode for generating high frequency wave embedded in the substrate;

An electrode system having a ceramic substrate, an electrode for generating high frequency wave and a heat resistor both embedded in the substrate.

The member 5 for supplying electric power is needed for supplying power to the electrode inside of the ceramic member.

The fixed member 3 is made of any material and may preferably be made of a metal having a high melting point, such as tantalum, tungsten, molybdenum, platinum, rhenium, hafnium and their alloys.

The joining layer may be made of any material not particularly limited. The main component of the joining layer may preferably be one or more metal selected from the group consisting of gold, platinum and palladium for relaxing stress in the joining portion. The content of the metal (as a main component) may preferably be 50 weight % or more with respect to all the metal components in the joining layer. The content may preferably be 70 weight percent or more, more preferably 80 weight percent or more, and most preferably 90 weight percent or more, with respect to all the metal components in the joined layer. Among them, gold is most preferred on the viewpoint of the resistance against oxidation.

The joining layer may preferably contain one or more active metal selected from the group consisting of titanium, zirconium, hafnium, vanadium, niobium and magnesium. It is thus possible to improve the adhesion property and joining strength of the joining layer to the ceramic member. The content of the active metal ingredient may preferably be 5 weight percent or lower.

Further, an alloy-forming component such as nickel, iron and cobalt may be added into the joining layer. In this case, the content of the alloy-forming component may preferably be 50 weight percent or less, more preferably 20 weight percent or less, and most preferably 10 weight percent or less.

One or more third components selected from the group consisting of Si, Al, Cu and In may be added into the joining layer.

In a preferred embodiment, a metal electrode and a terminal (fixed member) 3 made of molybdenum or the alloy of molybdenum are embedded in a ceramic member. The exposed face 3b of the terminal 3 is exposed to the joining face of the ceramic member.

Further in the present invention, the tubular air-tight sealing member 11 may be inserted into the recess 1b of the ceramic member and the member 4 to be joined may be inserted inside of the sealing member 11.

The member 4 to be joined may be the member for supplying electric power and may preferably be a conductor having a low thermal expansion coefficient. The conductor having a low thermal expansion coefficient means a conductor made of a material having a thermal expansion coefficient of $8.0 \times 10^{-6}/°$ C. or lower at a temperature 400° C. and lower. A material for the low thermal expansion conductor may be molybdenum, tungsten, molybdenum-tungsten alloy, tungsten-copper-nickel alloy or Kovar. A material for the air-tight sealing member may preferably be pure nickel, nickel based heat-resistive alloy, gold, platinum, silver or their alloys.

A material for the power supply member may preferably be a material having excellent corrosion resistance against the atmosphere. Specifically, pure nickel, nickel based heat-resistive alloy, gold, platinum, silver and their alloys are preferred.

Figure 4:
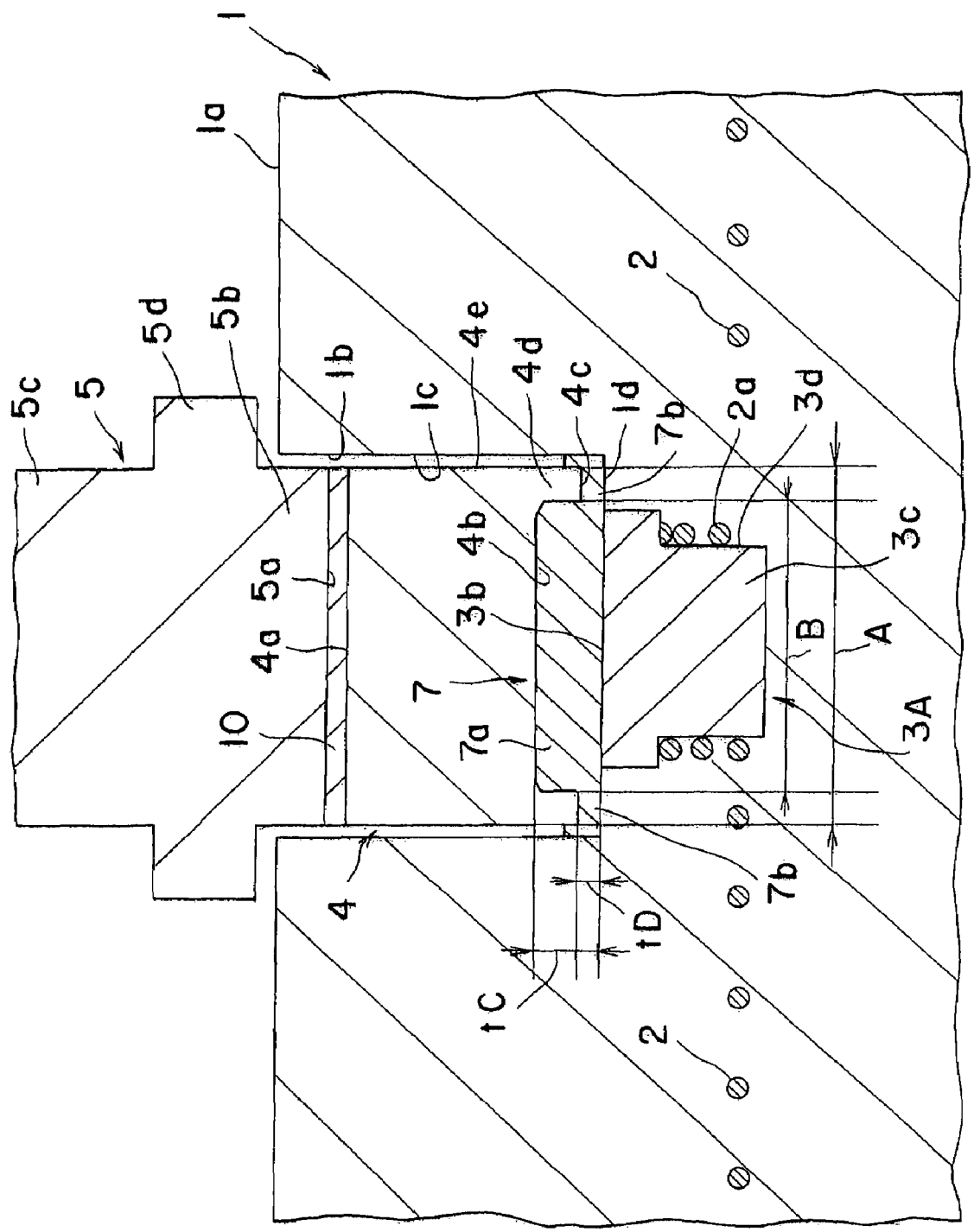
FIG. 4 shows an example of the present invention in which a heat generator has a shape of a coil spring wound around a fixed member 3A.
Figure 5:
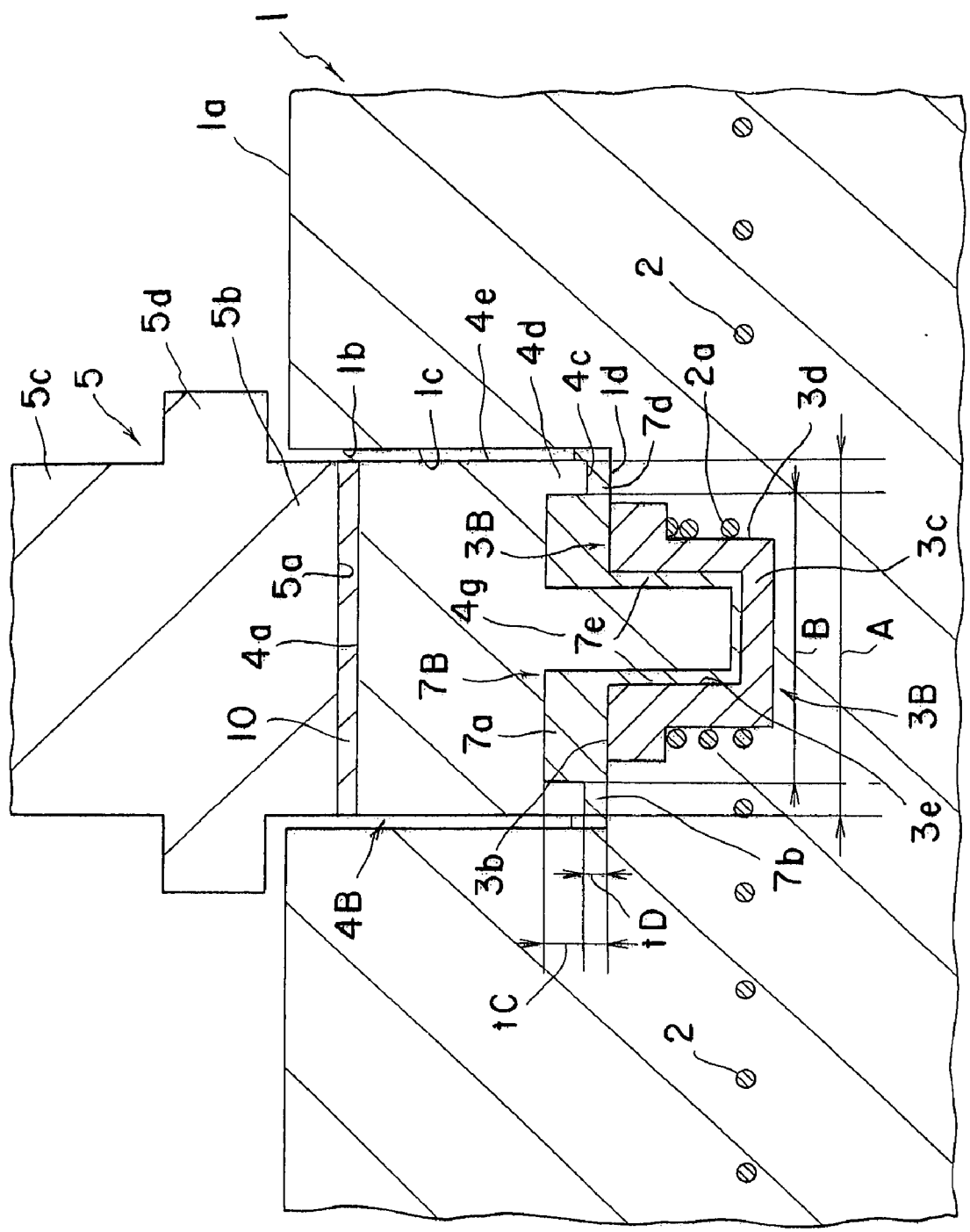
FIG. 5 is an example of the present invention in which a fixed member 3B has a recess 3e, a protrusion 4g is provided in the central region of a member to be joined, a joining layer 7e being provided between the inner wall of the recess and the protrusion.

FIGS. 4 and 5 are cross sectional views showing another modification according to the present invention. In an example shown in FIG. 4, a heat generator 2 is wound in a shape of a coil spring. Further, a fixed member 3A has a protrusion 3c. The end portion 2a of the heat generator 2 is wound to the side wall surface 3d of the protrusion 3c, so that the heat generator 2 is electrically connected to the fixed member 3. The heat generator 2 and fixed member may be electrically connected with each other by means of any methods.

In an example of FIG. 5, a protrusion 3c is provided in the fixed member 3B, and the end portion 2a of the heat generator 2 is wound around the side wall surface 3d of the protrusion 3c. In addition to this, a recess 3e is formed on the side of the joining face 3b of the fixed member 3. A protrusion 4g is provided on the side of the joining face of a member 4B to be joined at a location corresponding to that of the recess 3e of the fixed member 3. In the present example, the end of the protrusion 4g is inserted into the recess 3e. A joining layer 7e is formed between the protrusion 4g and the wall surface of the recess 3e.

The protrusion 4g of the member 4 to be joined is inserted into the recess 3e of the fixed member 3 to provide a joining layer also between the outer wall surface of the protrusion 4g and the inner wall surface of the recess 3e. It is thus possible to increase the joined area and to further improve the joining strength.

EXAMPLES

A joined structure shown in FIG. 3 was produced. Specifically, aluminum nitride powder was subjected to uniaxial press molding to produce a disk-shaped body. A metal mesh made of molybdenum was used, which had 0.12 mm-diameter molybdenum wires knitted at a density of 50 wires per inch. The metal mesh 2 was embedded in the disk shaped body. Further, a cylinder-shaped molydnenum terminal 3 having a diameter of 3 mm and a height of 1.5 mm was embedded in the shaped body of aluminum nitride. The shaped body was then set in a mold in the state that the shaped body was sealed in a carbon foil, and sintered at a temperature of 1950° C. under a pressure of 200 kg/cm² for a holding time of 2 hours by hot pressing. A sintered body was thus obtained having a relative density of 98.0% or higher. The thus obtained sintered body was processed from the back face with a machining center to form the recess 1b, thereby producing a specimen of the ceramics member. The specimen had a rectangular shape having a dimension of 20 mm×20 mm×17 mm.

The terminal 3 was ground to remove oxides and carbides on the surface, which was then washed and dried. A gold foil (diameter $\phi$ of 5.6 mm and thickness of 0.2 mm) and an Au-18 wt. % Ni foil (diameter $\phi$ of 5.6 mm and thickness of 0.1 mm) were set on the terminal 3. An air-tight sealing member 11 was fixed around the terminal and foils. Further, A Koval plate with a diameter $\phi$ of 4.7 mm and a thickness of 2.2 mm was set on the metal foils as the conductor 4 of a low thermal expansion coefficient. A foil of an Au-18 wt. % Ni alloy (diameter $\phi$ of 4.7 mm and thickness of 0.2 mm) was set on the conductor 4 of a low thermal coefficient. The rod-shaped member 5 for supplying electric power made of nickel was then mounted thereon.

500 grams of a load was applied on the thus obtained assembly, which was then heated for 10 minutes at 1000° C. in vacuum to produce a joined structure shown in FIG. 3.

The depth (tC−tD) of the recess 4d was 0.2 mm in an example 1, and 0.5 mm in an example 2. In an example 3, "tC" was 0.2 mm and a titanium foil (diameter $\phi$ of 5.6 mm and thickness of 0.01 mm) was inserted between the terminal 3 and gold foil. In an comparative example 1, the bottom face of the conductor 4 of a low thermal expansion coefficient was made flat in which the recess 4d was not provided.

Each of the thus obtained joined structures was subjected to a measurement of a tensile strength (a tensile load for breakage) after joining, and the results were shown in Table 1.

Moreover, with respect to the joined structures, 100 thermal cycles each between 100° C. and 700° C. were applied. In this case, a temperature ascending rate was both about 20° C./minute, and a temperature descending rate was about 5° C./minute. After that, a tensile strength after thermal cycles was measured, and the results were shown in table 1.

TABLE 1

| No. | Depth of pool For blazing material t (mm) | Ti foil | Tensile strength (kgf) Before thermal Cycles | After thermal Cycles |
|---|---|---|---|---|
| Example 1 | 0.2 | Absent | 150 | 148 |
| Example 2 | 0.5 | Absent | 155 | 150 |
| Example 3 | 0.2 | Present | 200 | 180 |
| Comparative Example 1 | 0.0 | Absent | 130 | 80 |

The tensile strength after thermal cycles was proved to be considerably reduced in the comparative example 1, and not reduced in the examples 1, 2 and 3. Further, in the example 3, the foil of an active metal (titanium foil) was also used so that the brazing material strongly adhered onto the ceramic member 1 to further improve the tensile strength.

Figure 6:
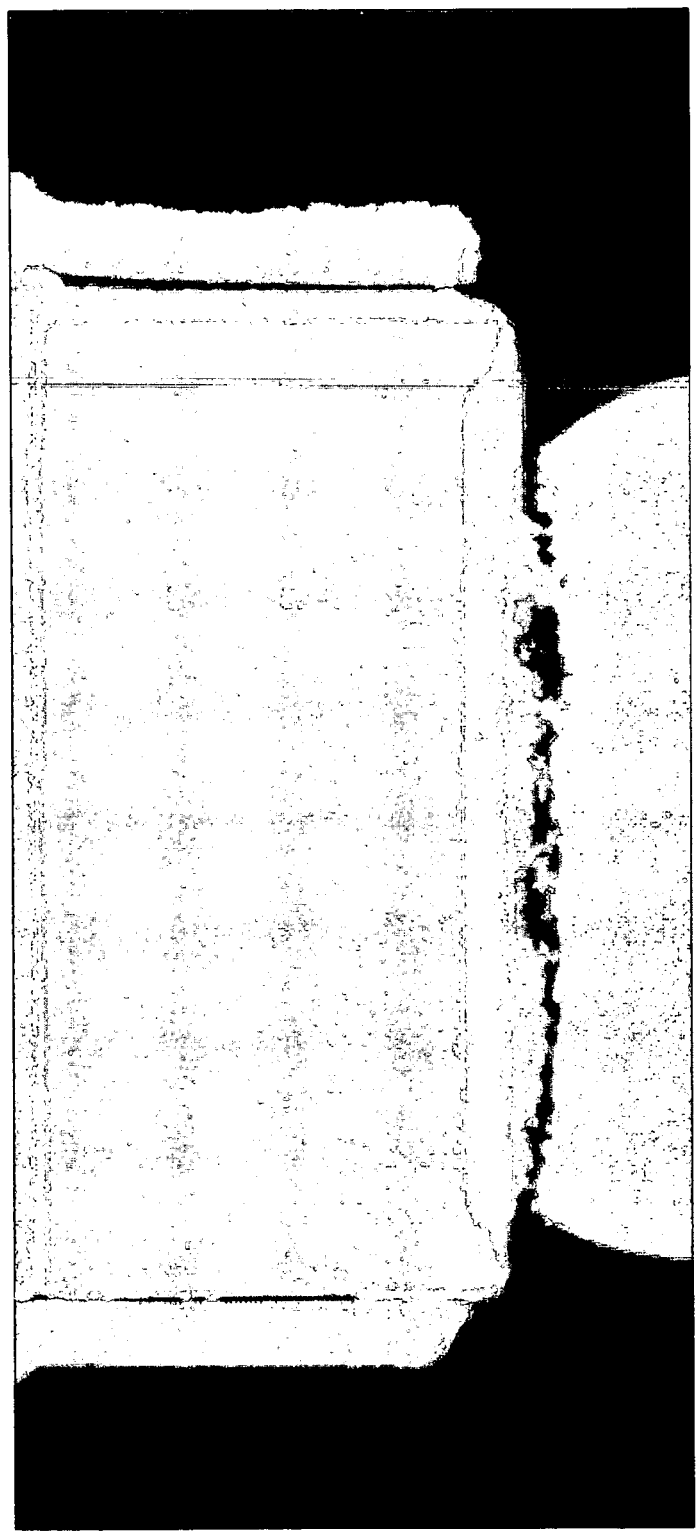
FIG. 6 is a photograph taken by an optical microscope of a joined structure according to the present invention.

FIG. 6 is a photograph showing the joined structure of the example 1 taken by an optical microscope. As shown in FIG. 6, it was proved that a thicker portion having a uniform thickness was generated.

As described above, the present invention provides a joined structure having a ceramic member, a metal member, a metal fixed member fixed to the ceramic member and having an exposed face exposed along the joining face of the ceramic member, and a joining layer, so that cracks may be prevented after thermal cycles.

The invention claimed is:

1. A joined structure comprising:
   a ceramic member;
   a metal member to be joined having a joining face, said metal member further comprising a protrusion on said joining face, said protrusion being integrated with said metal member and being of the same material as said metal member;
   a metal fixed member fixed to said ceramic member and having an exposed face; and
   a joining layer provided between said ceramic member and said joining face of said metal member and between said exposed face of said fixed member and said joining face of said metal member, said joining layer comprising thicker and thinner portions, said thicker portion being thicker than said thinner portion, and said thinner portion being interposed between said protrusions and said ceramic member.

2. The joined structure of claim 1, wherein said thicker portion has a thickness of 0.15 mm or more.

3. The joined structure of claim 1, wherein said thicker portion is provided on the peripheral part of said joining face of said metal member.

4. The joined structure of claim 1, further comprising an outer member joined with said metal member.

5. The joined structure of claim 1, wherein said joining layer comprises one or more metal, as a main component, selected from the group consisting of gold, platinum and palladium.

6. The joined structure of claim 1, wherein said joining layer comprises one or more active metal component selected from the group consisting of titanium, zirconium, hafnium, vanadium, niobium and magnesium.

7. The joined structure of claim 1, wherein a recess is formed in said ceramic member, and said metal member is contained in said recess.

8. The joined structure of claim 7, further comprising a tubular sealing body, and said metal member is contained inside of said tubular sealing body.

9. The joined structure of claim 1, wherein said ceramic member has a conductive member electrically connected with said fixed member.

* * * * *